(12) United States Patent
Pettersson et al.

(10) Patent No.: US 7,015,755 B2
(45) Date of Patent: Mar. 21, 2006

(54) STACKED MODULATOR AND AUTOMATIC GAIN CONTROL AMPLIFIER

(75) Inventors: Markus Pettersson, Turku (FI); Simo Murtojarvi, Salo (FI)

(73) Assignee: Nokia Corporation, Espoo (FI)

( * ) Notice: Subject to any disclaimer, the term of this patent is extended or adjusted under 35 U.S.C. 154(b) by 641 days.

(21) Appl. No.: 09/945,546

(22) Filed: Aug. 31, 2001

(65) Prior Publication Data

US 2003/0045256 A1   Mar. 6, 2003

(51) Int. Cl.
*H03F 3/45* (2006.01)
(52) U.S. Cl. ...................... 330/254; 455/333
(58) Field of Classification Search ................. 455/333
See application file for complete search history.

(56) References Cited

U.S. PATENT DOCUMENTS

| | | | | |
|---|---|---|---|---|
| 6,057,714 A | * | 5/2000 | Andrys et al. | 327/105 |
| 6,140,849 A | | 10/2000 | Trask | |
| 6,212,369 B1 | * | 4/2001 | Avasarala | 455/333 |
| 6,316,996 B1 | * | 11/2001 | Puotiniemi | 330/254 |
| 6,370,372 B1 | * | 4/2002 | Molnar et al. | 455/323 |
| 6,553,213 B1 | * | 4/2003 | Kikuchi | 330/129 |
| 6,563,375 B1 | * | 5/2003 | Khosrowbeygi et al. | 327/563 |
| 6,768,391 B1 | * | 7/2004 | Dent et al. | 332/185 |
| 2003/0045248 A1 | * | 3/2003 | Chominski | 455/118 |
| 2003/0045258 A1 | * | 3/2003 | Gonya, Sr. | 455/252.1 |

FOREIGN PATENT DOCUMENTS

JP        2000091849        3/2000

* cited by examiner

*Primary Examiner*—Creighton Smith
(74) *Attorney, Agent, or Firm*—Alfred A. Fressola; Ware, Fressola, Van Der Sluys & Adolphson LLP

(57) ABSTRACT

A circuit arrangement that stacks a modulator and automatic gain control (AGC) amplifier so as to re-use the modulator output current to drive the AGC amplifier, thereby saving power consumption and avoiding an unnecessary signal transformation between the two stages. A balanced circuit topology is used. The modulation signal can be selected over a wide range (100 MHz to 5.4 GHz) and the circuit arrangement is therefore particularly suitable for wireless applications (e.g. GSM-EDGE) and for integrated circuit fabrication.

18 Claims, 9 Drawing Sheets

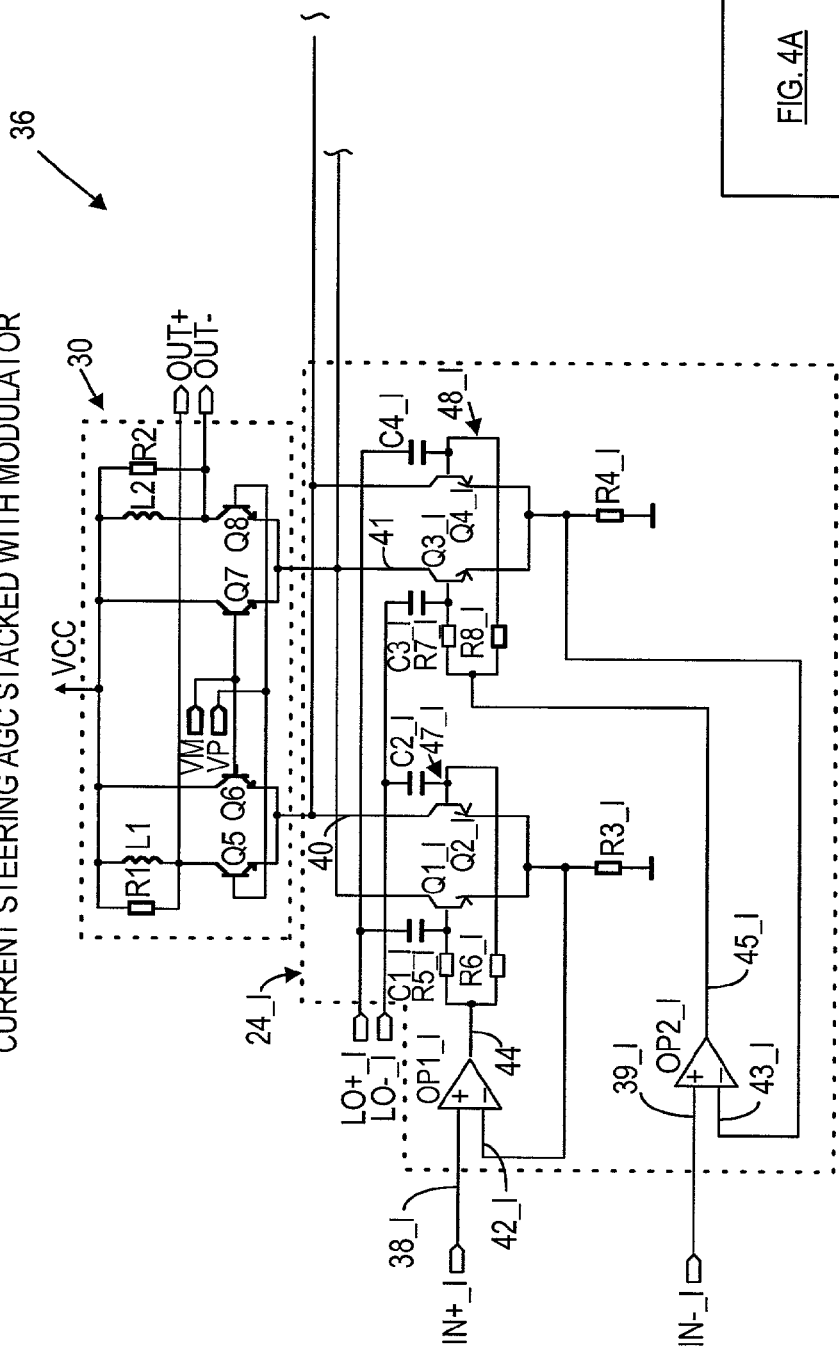

STACKED MODULATOR AND AUTOMATIC GAIN CONTROL AMPLIFIER

TECHNICAL FIELD

The present invention relates to a circuit arrangement in which a modulator and an automatic gain control (AGC) amplifier are connected to each other so as to avoid unnecessary signal transformation and to re-use the modulator current in the AGC so as to save power.

BACKGROUND OF THE INVENTION

It is known in the art to have a circuit arrangement for combining two circuits so as to use a common supply voltage. Thus it is known such as in EP 0 442,637 to combine a high frequency amplifier circuit with a filter circuit such that the radio frequency amplifier circuit serves as a filter for the supply voltage produced by the supply voltage of the amplifier. Such a circuit arrangement can overcome the shortcomings of having a separate amplifier and filter circuit since the circuit arrangement uses current passing through the amplifier transistor for two purposes; namely, in conjunction with amplifying the input signal of the amplifier and for purposes of supplying current for the supply voltage to be produced. With respect to automatic gain control amplifiers, it is not known to combine such an amplifier for gain/power control in combination with a modulator so as to effectively stack the stages and thereby use the modulator current for the automatic gain control amplifier as well.

SUMMARY OF THE INVENTION

The present invention provides for use of a common supply current from the modulator for both an automatic gain control amplifier and the modulator associated with modulation of input signals by a local oscillator reference signal. Such an architecture is particularly suitable for use in NMP's current GSM transmitters used in the wireless industry. It is particularly suited for GSM-EDGE systems which, due to the requirements of such systems, present new challenges in transmitter design, one of them being a very tight Error Vector Magnitude (EVM). In order to meet this requirement, the power amplifier must be more linear than those used in prior GSM transmitters. One solution for this greater linearity requirement is to remove the gain control from the power amplifier and to use a linear amplifier instead. The gain control must then be performed in a separate gain control stage.

The present invention is particularly directed to use of a separate automatic gain control (AGC) amplifier stage that can be stacked with the modulator of the transmitter. The circuit topology presented herein enables a combination or "stacking" of the automatic gain control and the amplifier modulator. The modulator is a Gilbert cell-type double balanced structure and the AGC amplifier is based upon a current steering methodology. With this design, a very low voltage direct conversion modulator and an AGC amplifier can be stacked that enables re-use of the modulator current in the AGC amplifier. The circuitry is particularly designed for integration into a wireless telephone radio frequency integrated circuit (RFIC).

BRIEF DESCRIPTION OF THE DRAWINGS

For a fuller understanding and nature and objects of the present invention, reference should be made to the following detail description, taken in conjunction with the following drawings in which.

BEST MODE FOR CARRYING OUT THE INVENTION

Figure 1:
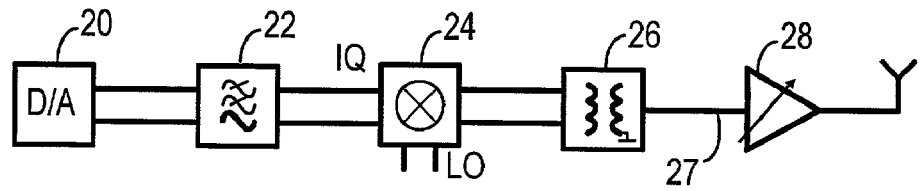
FIG. 1 is an overall block diagram of a prior art GSM transmitter.
Figure 2:
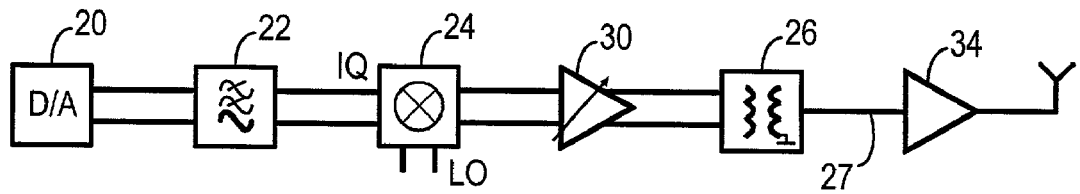
FIG. 2 is a block diagram of a GSM-EDGE transmitter necessary for obtaining better power amplification linearity than that used in a prior art GSM transmitter.

FIG. 1 is a block diagram of a wireless GSM transmitter having a direct conversion architecture. The analog components of the GSM transmitter are the digital/analog converter 20, a filter 22, a modulator 24, a transformer (balun) 26, and a power amplifier 28 having an automatic gain control amplifier incorporated therein. A transformer 26 is used to convert the differential output of the modulator into a single-ended signal 27 for use by a typical power amplifier 28. Such power amplifiers usually have a single-ended input. For next generation GSM-EDGE systems, there are new challenges placed on the transmitter design, one of them being the requirement for a very tight Error Vector Magnitude (EVM). In order to meet this requirement, the power amplifier must be implemented so as to have a much more linear gain than that used in a standard GSM transmitter. One solution which has been suggested is to remove the gain control from the power amplifier and to present the gain control as a separate gain control stage. In this manner, the power amplifier can be designed to have a more linear gain over its operating frequency. FIG. 2 represents such design in which the components are the same as shown in FIG. 1, except that a separate automatic gain control amplifier 30 is presented between the modulator 24 and the transformer 32 and a separate linear power amplifier 34 is used in place of the power amplifier with an integrated AGC as shown in FIG. 1.

Figure 3:
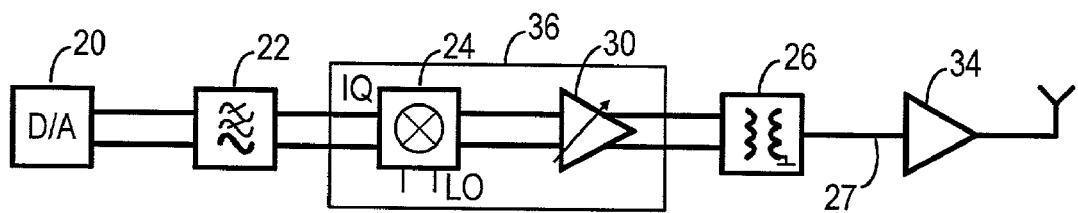
FIG. 3 is a block diagram of a typical GSM-EDGE type transmitter incorporating a stacked modulator and automatic gain control (AGC) amplifier according to the present invention.

The circuit arrangement shown in FIG. 2, although acceptable, does present added circuit design requirements to the radio frequency integrated circuit (RFIC) typically used in wireless devices. The overall block diagram of a typical transmitter for a GMS-EDGE system incorporating the technology of the present invention is shown in FIG. 3. As there seen, the modulator 24 and the automatic gain control (AGC) amplifier 30 are stacked relative to each other in a circuit arrangement 36. The modulator and AGC amplifier stages are therefore arranged in such a manner that the modulator current is re-used in the AGC amplifier, thereby resulting in associated current savings. This arrangement also eliminates unnecessary signal transformation from a current signal to a voltage signal between the modulator and the AGC amplifier. Furthermore, this arrangement provides that the input stage of the modulator can be very linear through use of operational amplifiers with associated feedback. The input stage associated with this circuit is more involved than prior art modulators which use a PMOS transistor and a current mirror rather than the present invention's use of operational amplifiers. Furthermore, a very low voltage supply Vcc can be used for a direct conversion modulator thereby achieving a 1.4 volt peak-to-peak linear output at the output of the automatic gain control circuit with use of a 2.5 volt Vcc power supply. The 1.4 volt peak-to-peak signal represents a +10 dBm power gain into a 100 ohm load.

Figure 4B:
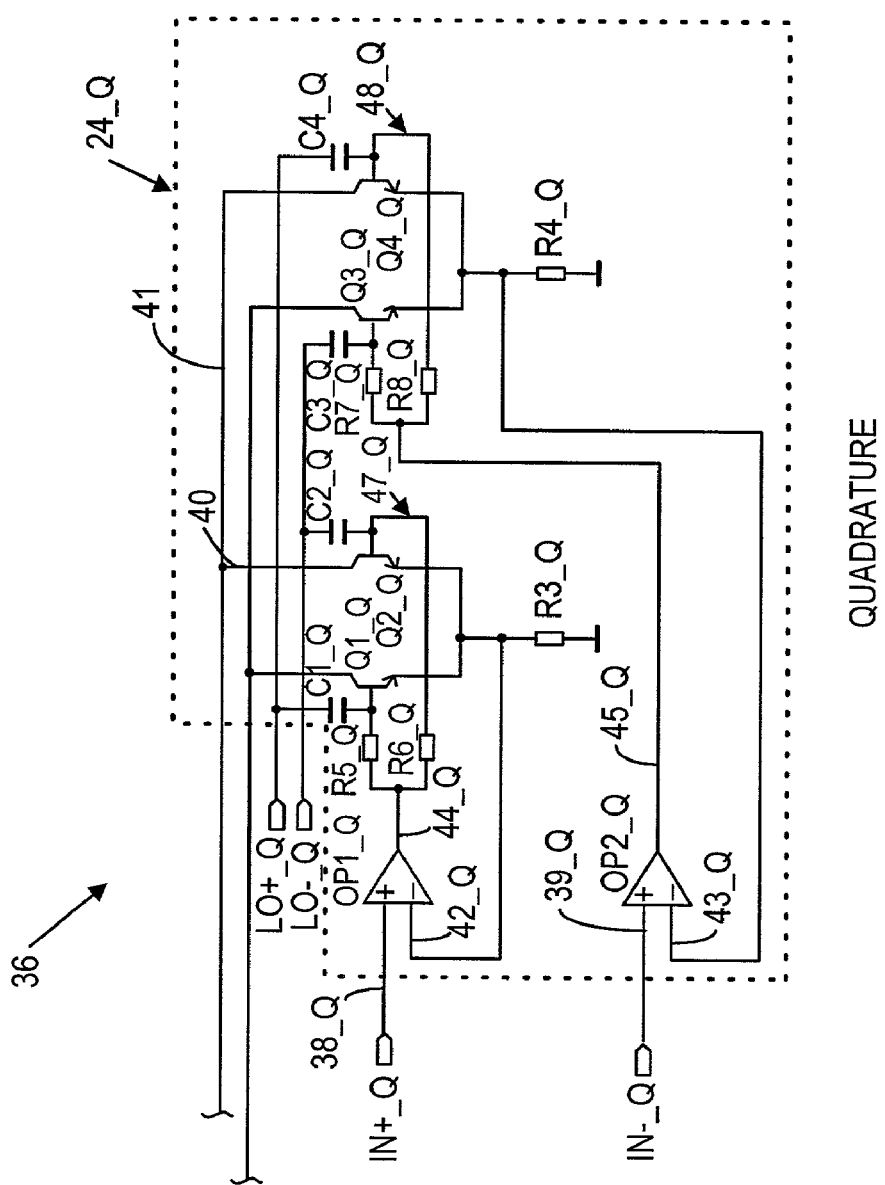
FIG. 4 is a schematic diagram of a stacked modulator (balanced design) and automatic gain control amplifier according to the present invention.
Figure 5:
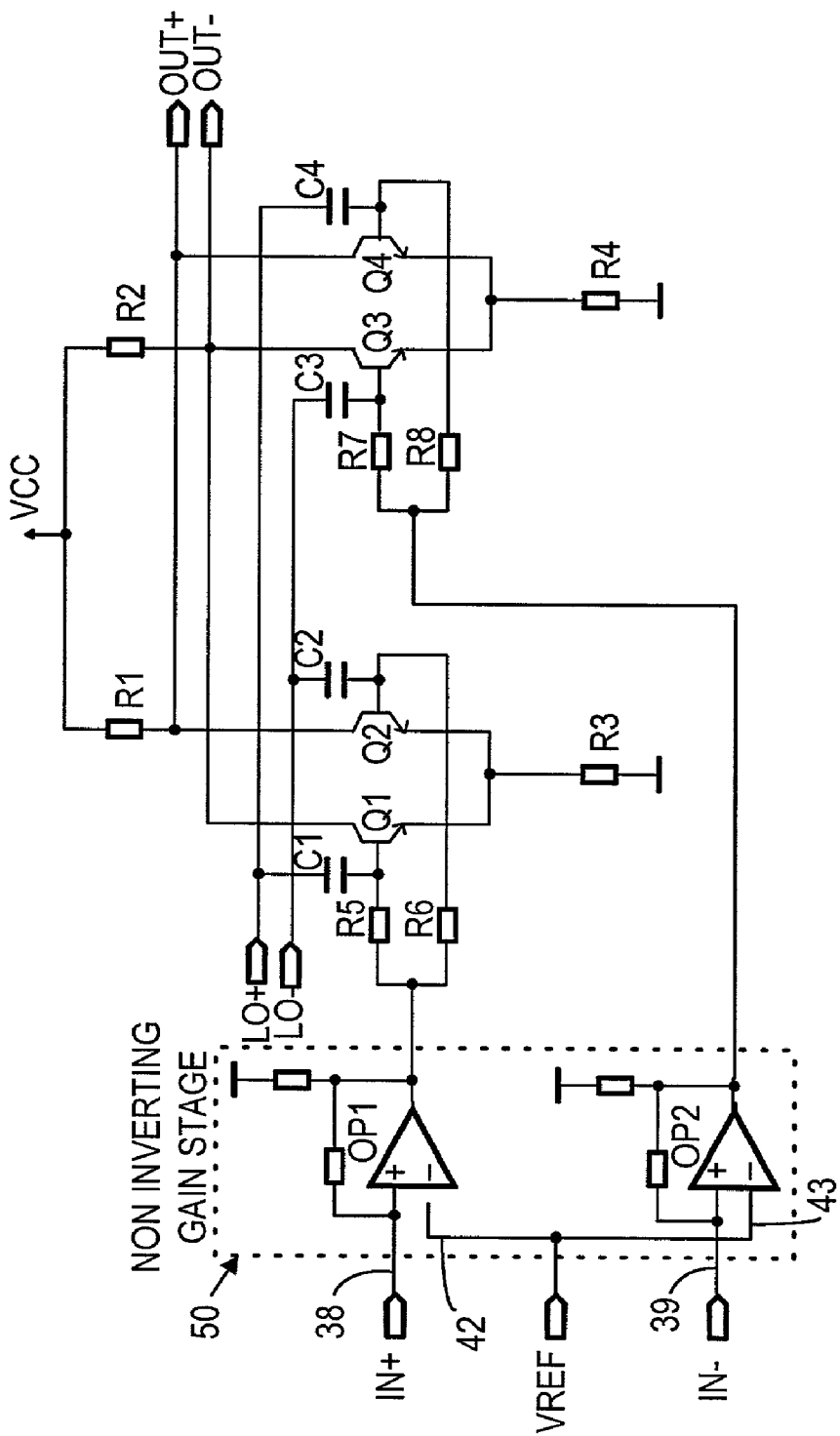
FIG. 5 is a schematic diagram of a stacked modulator and automatic gain control amplifier similar to that shown in FIG. 4 with the other half of the modulator the same as the half shown (balanced structure), further incorporating a non-inverting gain stage.

Embodiments of the Invention:

As best seen in FIGS. 3 and 4 (comprising FIGS. 4A and 4B) the circuit arrangement 36 comprises modulator 24 and stacked automatic gain control (AGC) amplifier 30. Throughout the description it should be noted that the modulator forming part of this circuit arrangement uses a balanced structure comprising inband and quadrature portions and thus the signal inputs and local oscillator inputs have both inband and quadrature portions. Inband signals and associated components are designated with an "_I" suffix and quadrature signals and components are designated with an "_Q" suffix. Only FIG. 4 shows both the inband and quadrature portions of the circuitry and it is understood that the other figures have such portions, but only the inband portion is shown. In this description, reference to a signal or component is made to the combination of both the inband and quadrature portions. For instance, reference to signal inputs IN+ and IN− means reference to inband signals inputs IN+_I and IN−_I as well as quadrature signal inputs IN_Q and IN−_Q. As shown in FIG. 4, modulator 24 has an inband portion 24_I and a quadrature portion 24_Q.

The modulator 24 and the automatic gain control (AGC) amplifier 30 are stacked relative to each other so that the AGC amplifier is able to re-use the modulator current at the modulator outputs 40 and 41. The signal inputs (IN+ and IN−) are presented to the modulator at a pair of inputs 38, 39 of operational amplifiers OP1 and OP2 with the other input terminal of the operational amplifiers (inputs of opposite polarity) respectively connected to resistors R3 and R4. The outputs 44 and 45 of the operational amplifiers represent a transformation of the input voltage to a current. The current presented at operational amplifier outputs 44 and 45 is converted to a modulated output at outputs 40 and 41 of modulating circuit 47 and 48 represented by transistors Q1, Q2, capacitors C1, C2 and resistors R5, R6 for modulator circuit 47 and transistors Q3, Q4, capacitors R7 and R8 and for modulator circuit 48. The modulation signal is obtained from a local oscillator reference signal presented at inputs LO+ and LO−. This modulation signal can be an intermediate frequency (IF) or a direct conversion modulation signal. For wireless applications this local oscillator modulation signal can therefore vary from approximately 100 MHz to 5.4 GHz.

It should be noted that the AGC amplifier 30 receives the modulated output at outputs 40 and 41 of modulator 24. The current signal is gain controlled by the AGC amplifier 30 through use of transistors Q5, Q6, Q7 and Q8. Transistor pairs Q5/Q6 and Q7/Q8 form two current steering pairs. Both the inband and quadrature outputs 40, 41 connect to these transistor pairs. The modulator is therefore a double balanced quadrature modulator. The amount of power presented to load R1 and R2 (with associated inductors L1 and L2) and to output terminals OUT+, OUT− is regulated by the voltage presented across inputs VM, VP. Since the signal current (modulated current signal at outputs 40, 41) are in opposite phase, power that is not presented at OUT+, OUT−, is presented to the other half of the AGC amplifier outputs. Thus, the AGC amplifier "dumps" part of the modulator current (and therefore power) to Vcc. It should be noted that the output power (current) of the modulator is constant and that the output power of the AGC amplifier is equal to or less than the modulator output power. This circuit arrangement does not imply low efficiency since high output power (>0 dBm) at the modulator output is required in any case (signal to noise (S/N) ratio must be very high). This circuit arrangement therefore enables re-use of the large current generated by the modulator.

Although outputs OUT+, OUT− shown in FIG. 4A are directly connected to R1, L1 and R2, L2 respectively, it would be known to a person of ordinary skill in the art that a capacitor or a capacitor in series with an inductor could be placed between R1, L1 and OUT+ and between R2, L2 and OUT−.

FIGS. 5, 6, 7 and 8 represent various modifications which can be made to the basic invention presented in FIG. 4. As seen in FIG. 4, the circuitry shown represents one-half of the entire circuitry, with the circuit topology being balanced. Thus in FIG. 5 a non-inverting gain stage 50 is shown which receives the signal inputs IN+, IN−, as well as a voltage reference VREF. These signals are presented to the operation amplifiers OP1 and OP2 in conjunction with feedback resistors. It should be noted that in these embodiments there is no feedback from the modulator that can lower the linearity of the AGC amplifier.

Figure 6:
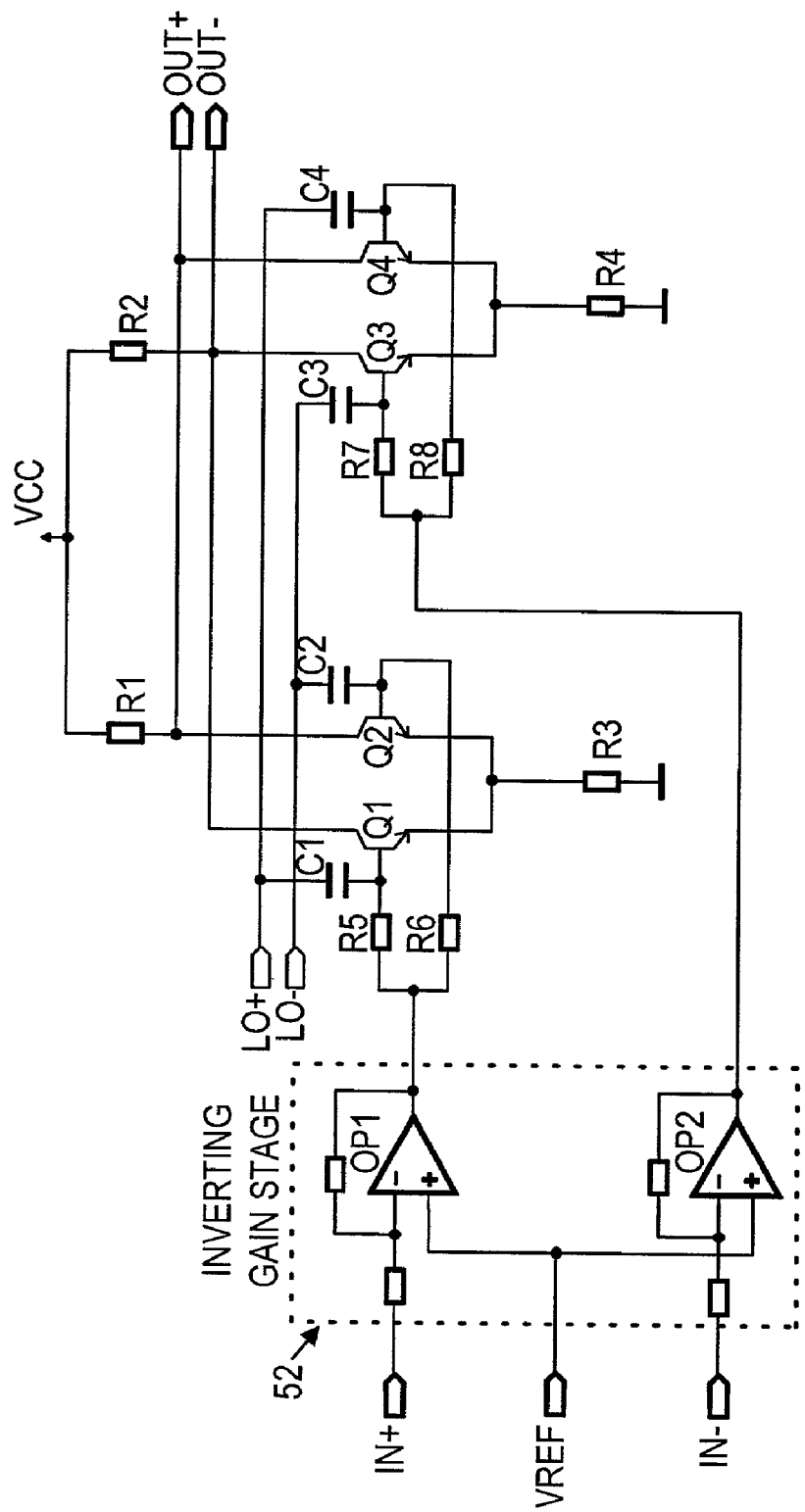
FIG. 6 is a schematic diagram of a stacked modulator and automatic gain control amplifier similar to that shown in FIG. 4 with the other half of the modulator the same as the half shown (balanced structure), further incorporating an inverting gain stage.

FIG. 6 represents a modification of the basic circuit in which an inverting gain stage 52 is used in conjunction with receipt of the signal inputs IN+, IN− with the voltage reference VREF (note that the signal inputs effectively connect to the negative inputs of the operational amplifiers). As noted above, the constant modulator current is re-used in the AGC amplifier although the AGC amplifier output current is equal to or less than the modulator output current. This circuit arrangement does not imply low efficiency for the reasons presented above.

Figure 7:
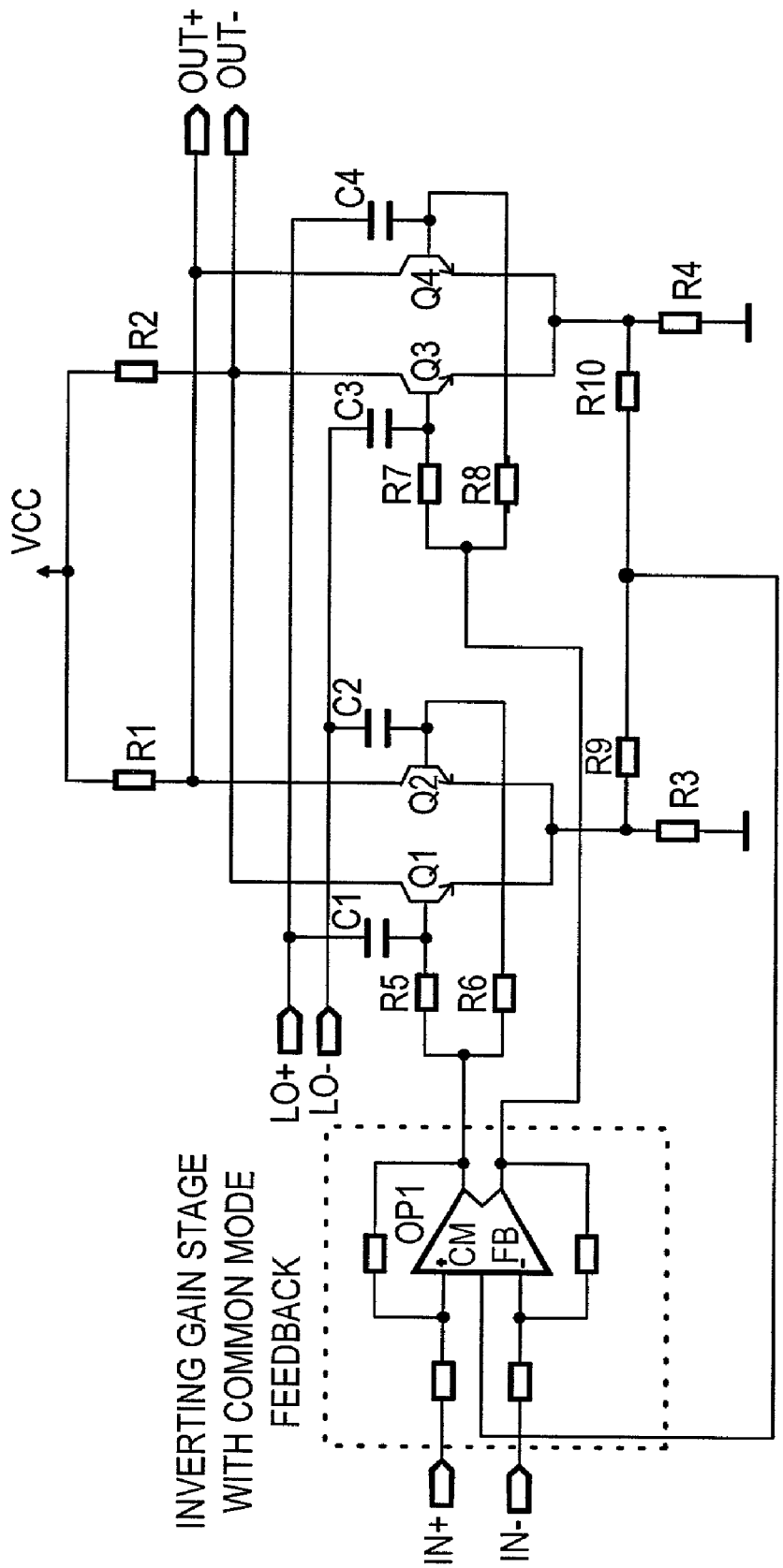
FIG. 7 is a schematic diagram of a stacked modulator and automatic gain control amplifier similar to that shown in FIG. 4 with the other half of the modulator the same as the half shown (balanced structure), further incorporating an inverting gain stage with common mode feedback.

FIG. 7 shows the use of an inverting gain stage 54, further having a common mode feedback. The input signals IN+, IN− are presented to the common mode feedback amplifier CMFB with the associated feedback resistors. The common mode feedback helps minimize the effects of the base to emitter voltage temperature variation associated with the bipolar junction transistor (BJT) modulator transistors Q1, Q2, Q3 and Q4 due to the output power changes.

Figure 8:
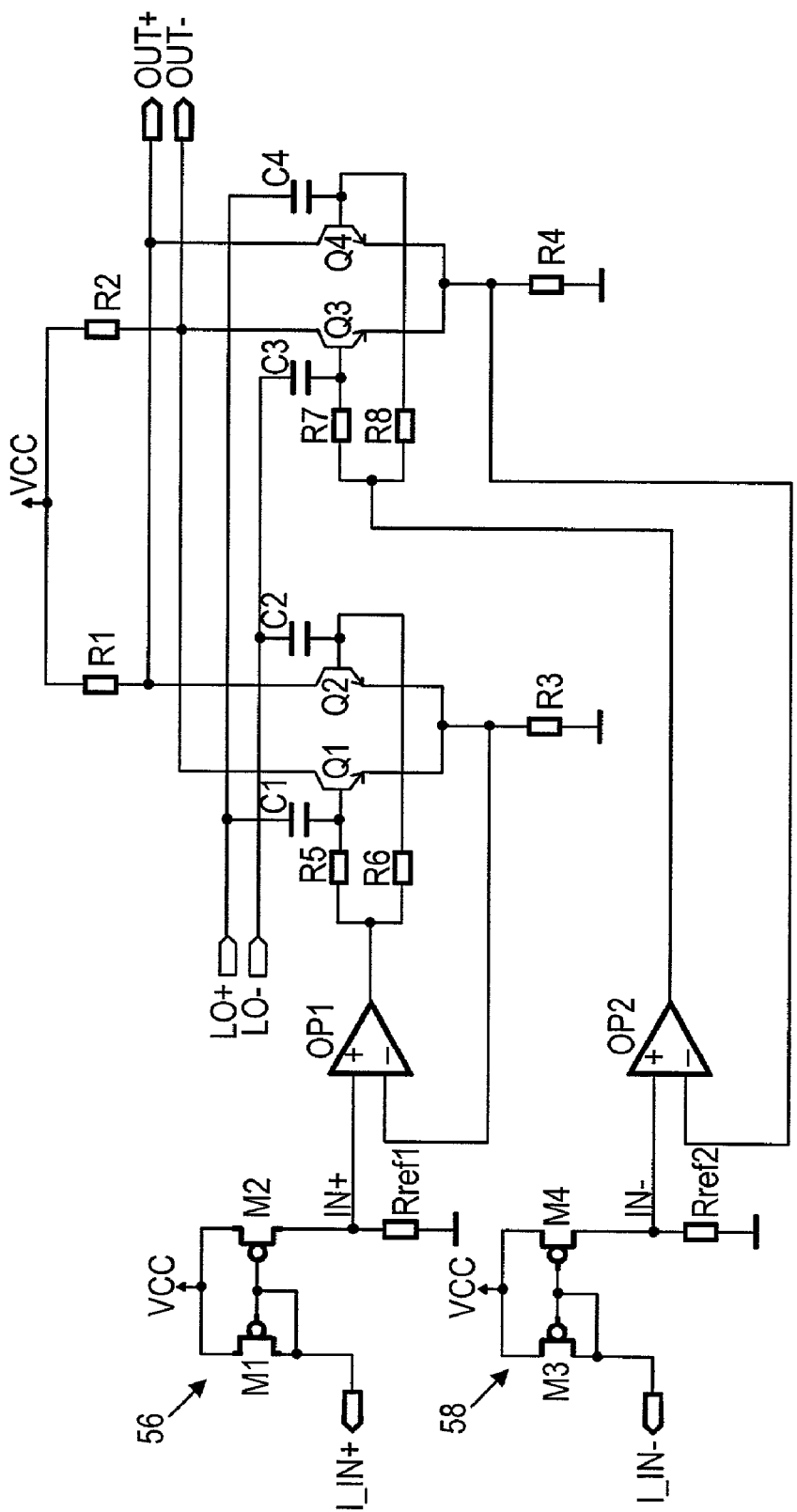
FIG. 8 is a schematic diagram of a stacked modulator and automatic gain control amplifier similar to that shown in FIG. 4 with the other half of the modulator the same as the half shown (balanced structure), further incorporating a current mode input signal from a digital/analog converter that is converted to a voltage with reference resistors.

FIG. 8 is another embodiment of the present invention which incorporates input stages 56 and 58 so as to compensate for lot variation of emitter resistors R3 and R4 by compensating with a current mode input signal from the digital-to-analog converter that is converted to a voltage by use of reference resistors $R_{ref1}$ and $R_{ref2}$. Resistors R3, R4, $R_{ref1}$ and $R_{ref2}$ have the same lot variation.

Figure 9:
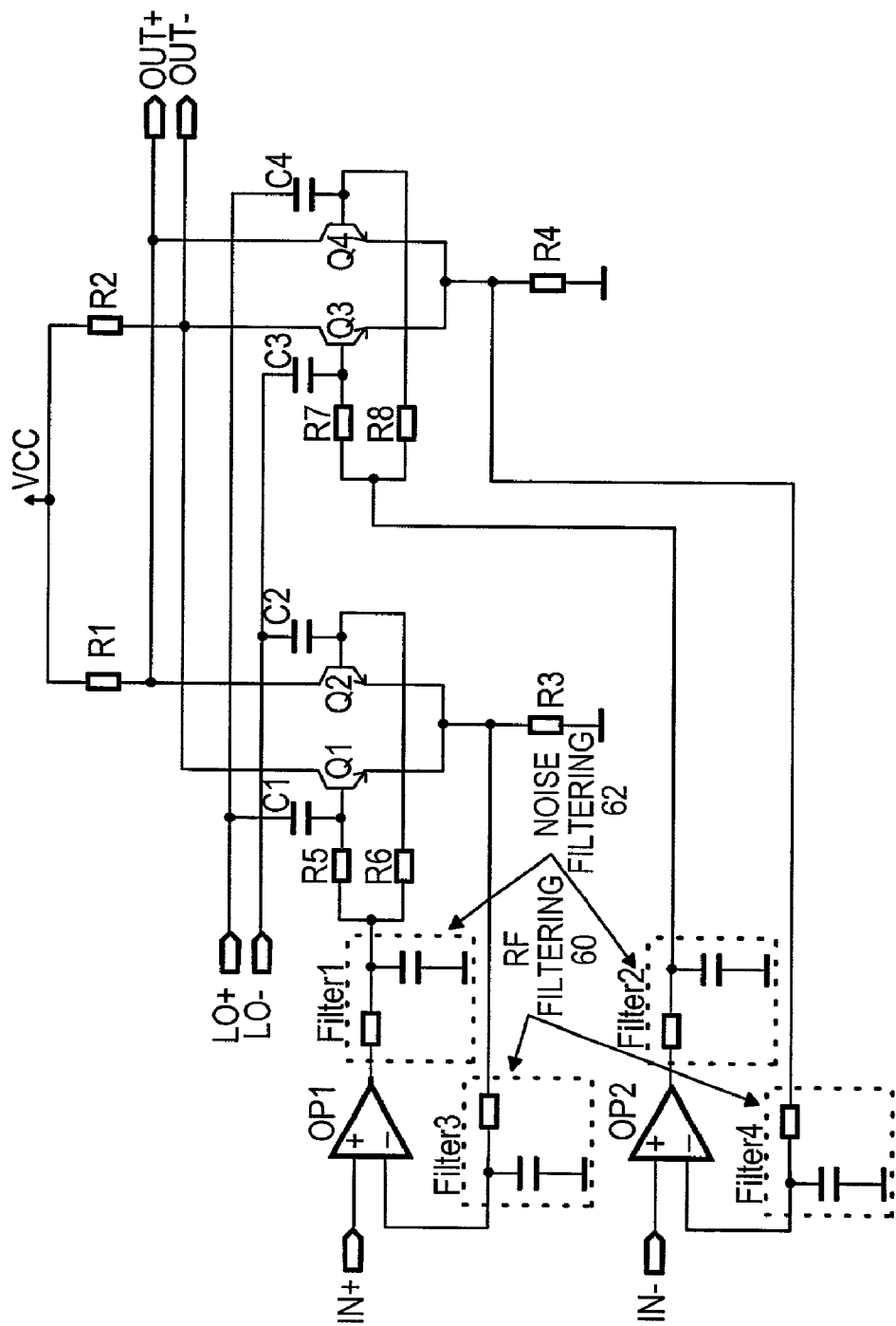
FIG. 9 is a schematic diagram of a stacked modulator and automatic gain control amplifier similar to that shown in FIG. 4 with the other half of the modulator the same as the half shown (balanced structure), further incorporating a low frequency filter and a noise filter.

FIG. 9 is another embodiment of the present invention, further comprising an RF filter 60 (RF filtering) as well as a noise filter 62 (NOISE FILTERING) associated with the operational amplifiers OP1 and OP2.

Figure 10:
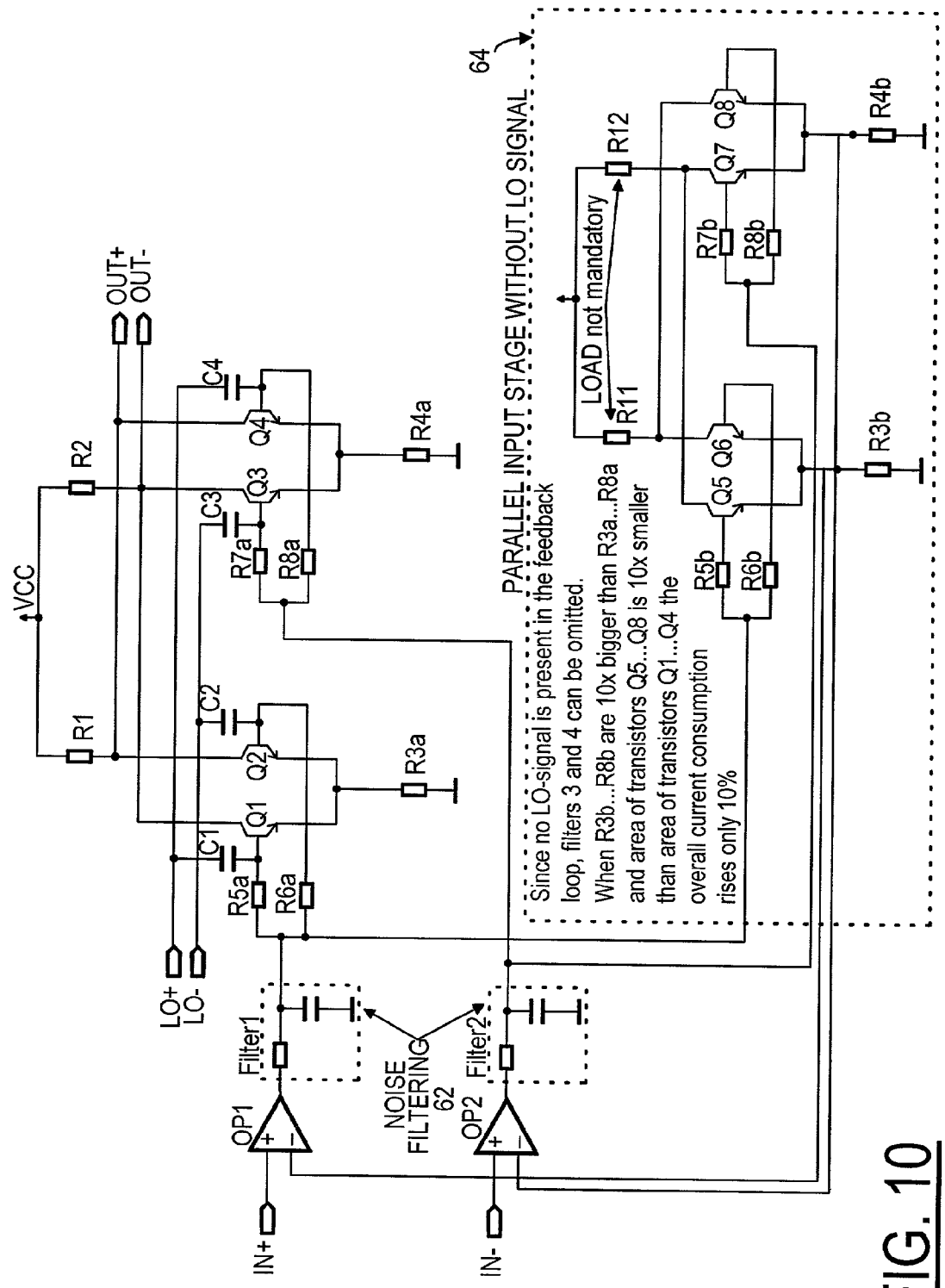
FIG. 10 is a schematic diagram of a stacked modulator and automatic gain control amplifier similar to that shown in FIG. 4 with the other half of the modulator the same as the half shown (balanced structure), further incorporating a noise filter and a parallel input stage without associated low frequency reference signals being used with the parallel input stage.

Finally, FIG. 10 is a further embodiment of the present invention having the noise filtering shown in FIG. 9 but further having a parallel input stage local oscillator signal circuit 64. The parallel input stage without the local oscillator signal is able to eliminate the needs for further noise filtering associated with the parallel input stage. Furthermore, when resistors R3b . . . R8b are ten times larger than R3a . . . R8a and the transistor Q5 . . . Q8 are ten times smaller in area than transistors Q1 . . . Q4, the overall current consumption only increases by approximately ten percent. The reason for this result can best be understood with reference to FIG. 9. It is there seen that there are eight total RC filters (four shown, balanced structure). Four filters are used for noise filtering and four are used to filter out the local oscillator signal from the feedback paths. Since the −3 dBm low pass corner frequency of each filter must be low in GSM applications (approximately 500 kHz) the RC product (resistance times capacitance) must be large. Large RC products therefore require large resistor values or large capacitance values (or both), which require large areas of silicon in order to fabricate on an IC. However, as seen in FIG. 10, when the feedback is taken from the parallel input stage 64 where the LO-signal is not present, there is no need for low pass filters in feedback paths, and thus does not require a large area of silicon. (bipolar junction transistors—BJTs—are small and therefore the parallel input stage is small).

Thus what has been shown is a stacked modulator and AGC amplifier, particularly for use in wireless communication devices. The stacked configuration allows the output modulation current to be directly re-used by the AGC amplifier, thereby saving current and hence power. The stacked configuration also avoids an unnecessary signal transformation from current to voltage between the modulator and the AGC amplifier. The stacked configuration is particularly suitable for implementation on an integrated circuit (IC), such as part of a CDMA/GSM dual mode radio. All components can be formed as part of the IC with the possible exceptions of the inductors shown in the various embodiment.

What is claimed is:

1. A circuit arrangement for combining a modulator and an automatic gain control (AGC) amplifier comprising:
  a modulator having inputs for receipt of signal inputs (IN+, IN−) and means for converting the signal inputs into modulated output current signals (OP1, OP2, R3, R4; Q1, Q2, Q3, Q4), based upon a local oscillator reference signal (LO+, LO−);
  an automatic gain control (AGC) amplifier operatively connected to the modulated output current signals of the modulator and also connected to a supply voltage (Vcc), the AGC amplifier further having means for amplifying said output current signals for delivering the output current signals to one of two balanced loads (R1, R2; and corresponding opposite phase components); wherein the output current signals are re-used by the AGC amplifier; and
  a non-inverting gain stage connected to the signal inputs (IN+, IN−) and having outputs connected to the inputs of the modulator.

2. A circuit arrangement for combining a modulator and an automatic gain control (AGC) amplifier comprising:
  a modulator having inputs for receipt of signal inputs (IN+, IN−) and means for converting the signal inputs into modulated output current signals (OP1, OP2, R3, R4; Q1, Q2, Q3, Q4), based upon a local oscillator reference signal (LO+, LO−);
  an automatic gain control (AGC) amplifier operatively connected to the modulated output current signals of the modulator and also connected to a supply voltage (Vcc), the AGC amplifier further having means for amplifying said output current signals for delivering the output current signals to one of two balanced loads (R1, R2; and corresponding opposite phase components); wherein the output current signals are re-used by the AGC amplifier; and
  an inverting gain stage having inputs connected to the signal inputs (IN+, IN−) and having outputs connected to the inputs of the modulator.

3. A circuit arrangement as defined in claim 2 wherein the inverting gain stage has a common mode feedback having inputs connected to the signal inputs (IN+, IN−) and having outputs connected to the inputs of the modulator.

4. A circuit arrangement for combining a modulator and an automatic gain control (AGC) amplifier comprising:
  a modulator having inputs for receipt of signal inputs (IN+, IN−) and means for converting the signal inputs into modulated output current signals (OP1, OP2, R3, R4; Q1, Q2, Q3, Q4), based upon a local oscillator reference signal (LO+, LO−); and
  an automatic gain control (AGC) amplifier operatively connected to the modulated output current signals of the modulator and also connected to a supply voltage (Vcc), the AGC amplifier further having means for amplifying said output current signals for delivering the output current signals to one of two balanced loads (R1, R2; and corresponding opposite phase components); wherein the output current signals are re-used by the AGC amplifier, wherein the modulator means for converting the signal inputs containing information into modulated output current signals comprises current mirrors with emitter transistors (Q1, Q2, Q3, Q4) and resistors (R3, R4) connected to the emitters of the transistors, wherein the current mode input signals (IN+, IN−) are signals presented to a current to voltage converter including reference resistors ($R_{ref1}$, $R_{ref2}$) for presenting the signal inputs (IN+, IN−) to the modulator based upon the voltage drop across the respective reference resistors, the current to voltage converter with the associated reference resistors compensating for variations in resistance values of the modulator emitter resistors (R3, R4).

5. A circuit arrangement as defined in claim 4, wherein the variation in percentage resistance values for the reference resistors ($R_{ref1}$, $R_{ref2}$) and the modulator emitter resistors (R3, R4) are substantially the same.

6. A circuit arrangement for combining a modulator and an automatic gain control (AGC) amplifier comprising:
   a modulator having inputs for receipt of signal inputs (IN+, IN−) and means for converting the signal inputs into modulated output current signals (OP1, OP2, R3, R4; Q1, Q2, Q3, Q4), based upon a local oscillator reference signal (LO+, LO−); and
   an automatic gain control (AGC) amplifier operatively connected to the modulated output current signals of the modulator and also connected to a supply voltage (Vcc), the AGC amplifier further having means for amplifying said output current signals for delivering the output current signals to one of two balanced loads (R1, R2; and corresponding opposite phase components); wherein the output current signals are re-used by the AGC amplifier, wherein the means for converting the signal inputs include operational amplifiers (OP1, OP2), wherein the inputs of the modulator are positive inputs to the operational amplifiers, and further wherein the circuit arrangement comprises:
   local oscillator filters each connected to a negative input of one of the operational amplifiers associated with the modulator; and
   noise filters each having an input connected to the output of one of the operational amplifiers (OP1, OP2) and having a filtered output connected to the modulator.

7. A circuit arrangement for combining a modulator and an automatic gain control (AGC) amplifier comprising:
   a modulator having inputs for receipt of signal inputs (IN+, IN−) and means for converting the signal inputs into modulated output current signals (OP1, OP2, R3, R4; Q1, Q2, Q3, Q4), based upon a local oscillator reference signal (LO+, LO−); and
   an automatic gain control (AGC) amplifier operatively connected to the modulated output current signals of the modulator and also connected to a supply voltage (Vcc), the AGC amplifier further having means for amplifying said output current signals for delivering the output current signals to one of two balanced loads (R1, R2; and corresponding opposite phase components); wherein the output current signals are re-used by the AGC amplifier, wherein the means for converting the signal inputs include operational amplifiers (OP1, OP2), wherein the inputs of the modulator are positive inputs to the operational amplifiers, and further the circuit arrangement comprises:
   noise filters each connected to an output of one of the modulator operational amplifiers (OP1, OP2); and
   a parallel input stage connected to the output of the noise filters, the parallel input stage comprising circuitry substantially the same as the modulator circuitry but without connection to the local oscillator reference signal.

8. A transmitter for use in a mobile communications apparatus comprising:
   a digital to analog (D/A) converter (20) for converting digital information into an analog signal input;
   a modulator (24) operatively connected to the D/A converter (20) for modulating the signal inputs with a modulating signal so as to generate a modulated output signal;
   an automatic gain control (AGC) amplifier (30) operatively connected to the modulator for controlling the gain of the modulated output signal; and
   an amplifier (34) operatively connected to the output of the AGC amplifier for amplifying the gain controlled modulated output signal;
   wherein the modulator (24) and the AGC amplifier (30) are combined to form a circuit arrangement (36), and
   wherein the modulator has inputs for receipt of the signal inputs (IN+, IN−) and means for converting the signal inputs into modulated output current signals (OP1, OP2, R3, R4; Q1, Q2, Q3, Q4) based upon a local oscillator reference signal (LO+, LO−); and
   wherein the AGC amplifier is operatively connected to the modulated output current signals of the modulator and also connected to a supply voltage (Vcc), the AGC amplifier further having means for amplifying said output current signals for delivering the output current signals to one of two balanced loads (R1, R2); wherein the output current signals are re-used by the AGC amplifier.

9. A transmitter for use in a mobile communications apparatus as defined in claim 8, wherein the AGC amplifier has means for controlling the amount of the amplified output current signals to present to either one of the two balanced loads, wherein this control of the amount of the amplified output current signals is dependent upon a control voltage (VP, VM) presented to the AGC amplifier.

10. A transmitter for use in a mobile communications apparatus, as defined in claim 9, wherein the modulator means for converting the signal inputs into modulated output current signals comprises:
   means for converting the signal inputs from a voltage to a current (OP1, OP2, R3, R4) and a modulating circuit ($Q_1$, $Q_2$, $Q_3$, $Q_4$) that receives the output of the voltage to current converting means and the local oscillator reference signal (LO+, LO−) so as to modulate the current conversion of the signal inputs with the local oscillator reference signal.

11. A transmitter for use in a mobile communications apparatus as defined in claim 8, wherein the modulator means for converting the signal inputs into modulated output current signals comprises:
   means for converting the signal inputs from a voltage to a current (OP1, OP2, R3, R4) and a modulating circuit ($Q_1$, $Q_2$, $Q_3$, $Q_4$) that receives the output of the voltage to current converting means and the local oscillator reference signal (LO+,LO−) so as to modulate the current conversion of the signal inputs with the local oscillator reference signal.

12. A transmitter for use in a mobile communications apparatus as defined in claim 8, further comprising:
   a non-inverting gain stage connected to the signal inputs (IN+, IN−) and having outputs connected to the inputs of the modulator.

13. A transmitter for use in a mobile communications apparatus as defined in claim 8, further comprising:
   an inverting gain stage having inputs connected to the signal inputs (IN+, IN−) and having outputs connected to the inputs of the modulator.

14. A transmitter for use in a mobile communications apparatus as defined in claim 8, further comprising:
   an inverting gain stage with common mode feedback having inputs connected to the signal inputs (N+, N−) and having outputs connected to the inputs of the modulator.

15. A transmitter for use in a mobile communications apparatus as defined in claim 8, wherein the modulator means for converting the signal inputs into modulated output current signals comprises current mirrors with emitter transistors (Q1, Q2, Q3, Q4) and resistors (R3, R4) connected to the emitters of the transistors, wherein the current mode signal inputs (IN+, IN−) are presented to a current to voltage converter including reference resistors ($R_{ref1}$, $R_{ref2}$) for presenting the signal inputs (IN+, IN−) to the modulator based upon the voltage drop across the respective reference resistors, the current to voltage converter with the associated reference resistors compensating for variations in resistance values of the modulator emitter resistors (R3, R4).

16. A transmitter for use in a mobile communications apparatus as defined in claim 15, wherein the variation in percentage resistance values for the reference resistors ($R_{ref1}$, $R_{ref2}$) and the modulator emitter resistors (R3, R4) are substantially the same.

17. A transmitter for use in a mobile communications apparatus as defined in claim 8, wherein the means for converting the signal inputs include operational amplifiers (OP1, OP2), wherein the inputs of the modulator are positive inputs to the operational amplifiers, and further wherein the circuit arrangement comprises:

local oscillator filters each connected to a negative input of one of the operational amplifiers associated with the modulator; and noise filters each having an input connected to the output of one of the operational amplifiers (OP1, OP2) and having a filtered output connected to the modulator.

18. A transmitter for use in a mobile communications apparatus as defined in claim 8, wherein the means for converting the signal inputs include operational amplifiers (OP1, OP2), wherein the inputs of the modulator are positive inputs to the operational amplifiers, and further the circuit arrangement comprises:

noise filters each connected to an output of one of the modulator operational amplifiers (OP1, OP2); and a parallel input stage connected to the output of the noise filters, the parallel input stage comprising circuitry substantially the same as the modulator circuitry but without connection to the local oscillator reference signal.

* * * * *

UNITED STATES PATENT AND TRADEMARK OFFICE
CERTIFICATE OF CORRECTION

| | |
|---|---|
| PATENT NO. | : 7,015,755 B2 |
| APPLICATION NO. | : 09/945546 |
| DATED | : March 21, 2006 |
| INVENTOR(S) | : Pettersson et al. |

It is certified that error appears in the above-identified patent and that said Letters Patent is hereby corrected as shown below:

At column 8, line 65, claim 14, line 4, please replace "(N+,N-)" with –(IN+,IN-)--.

Signed and Sealed this

Twenty-second Day of August, 2006

JON W. DUDAS
*Director of the United States Patent and Trademark Office*